United States Patent
Bohnert et al.

(10) Patent No.: US 7,450,792 B2
(45) Date of Patent: Nov. 11, 2008

(54) FIBER-OPTIC SENSOR COIL AND CURRENT OR MAGNETIC-FIELD SENSOR

(75) Inventors: Klaus Bohnert, Oberrohrdorf (CH);
Philippe Gabus, Nussbaumen (CH);
Juergen Nehring, Wettingen (CH);
Hubert Braendle, Oberengstringen (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 11/594,170

(22) Filed: Nov. 8, 2006

(65) Prior Publication Data
US 2007/0052971 A1 Mar. 8, 2007

Related U.S. Application Data

(63) Continuation of application No. PCT/CH2005/000221, filed on Apr. 21, 2005.

(30) Foreign Application Priority Data
May 13, 2004 (EP) .................................. 04405308

(51) Int. Cl.
*G02B 6/00* (2006.01)
(52) U.S. Cl. .......................................... 385/13; 385/12
(58) Field of Classification Search .................. None
See application file for complete search history.

(56) References Cited

U.S. PATENT DOCUMENTS

| 4,768,487 A | 9/1988 | Yamamoto et al. |
| 5,022,371 A | 6/1991 | Daly |
| 5,053,693 A * | 10/1991 | Bohnert et al. ................ 324/96 |
| 5,934,252 A | 8/1999 | Hafner et al. |

(Continued)

FOREIGN PATENT DOCUMENTS

EP 0 856 737 A1 8/1998

(Continued)

OTHER PUBLICATIONS

International Preliminary Report on Patentability dated Apr. 12, 2005.

(Continued)

*Primary Examiner*—Sung Pak
*Assistant Examiner*—Chad H Smith
(74) *Attorney, Agent, or Firm*—Buchanan Ingersoll & Rooney PC (57) ABSTRACT

A fiber-optic sensor head is disclosed for an optical current or magnetic-field sensor which can have an optical fiber which includes a magnetooptically active sensor fiber which is optically connected to at least one polarization-defining element. The sensor fiber can be arranged in a magnetic field to be measured or around a conductor carrying current to be measured and can be in the form of a coil, with the coil defining a coil plane (A) with a surface normal ($N_s$), and with the at least one polarization-defining element having a marked axis (f). The sensor head can be flexible in the area of the sensor fiber, and an adjustment means can be provided for adjustment of a predeterminable angle β between the marked axis,(f) and the surface normal ($N_s$) or for adjustment of predeterminable angles β, β' between the marked axes (f) and the surface normal ($N_s$).

33 Claims, 4 Drawing Sheets

U.S. PATENT DOCUMENTS 5,953,121 A * 9/1999 Bohnert et al. .............. 356/481
2005/0088662 A1 * 4/2005 Bohnert et al. .............. 356/483

FOREIGN PATENT DOCUMENTS

| EP | 1 150 000 A2 | 10/2001 |
| EP | 1 512 981 A1 | 3/2005 |
| JP | 9-068618 A | 3/1997 |
| JP | 2000-121675 A | 4/2000 |
| JP | 2001-083187 A | 3/2001 |
| WO | 94/00768 A1 | 1/1994 |
| WO | 03/071290 A1 | 8/2003 |

OTHER PUBLICATIONS

International Search Report dated Jul. 4, 2005.
Form PCT/ISA/237 (Written Opinion of the International Searching Authority).
European Search Report dated Oct. 13, 2004 (with English translation of category of cited documents).

* cited by examiner

FIBER-OPTIC SENSOR COIL AND CURRENT OR MAGNETIC-FIELD SENSOR

RELATED APPLICATIONS

This application is based on and claims priority under 35 U.S.C. §119 to European Application No. 04405308.0, filed May 13, 2004, and is a continuation application under 35 U.S.C. §120 of International Application No. PCT/CH2005/00221, filed Apr. 21, 2005, designating the United States, the entire contents of both of which are hereby incorporated by reference.

TECHNICAL FIELD

A fiber-optic sensor system is disclosed, as is a sensor head, a current or magnetic-field sensor, and a high-voltage installation. A method is disclosed for production of a sensor head.

PRIOR ART

One such sensor head is disclosed, for example, in EP 0 856 737 A1. This document describes a fiber-optic current sensor having a sensor head which contains a sensor fiber, which is arranged in a capillary and forms a sensor coil. The fiber coating is removed from the sensor fiber, and the fiber is then thermally treated in order to remove mechanical stresses which lead to disturbing influences resulting from inadvertent birefringence. This can result in better temperature stability of sensor-measurements. An inert gas or else an oil can be introduced into the capillary for preventing the ingress of moisture or chemically aggressive vapors into the capillary interior, which could chemically damage the sensor fiber from which the fiber coating has been removed.

A sensor head such as this can have the disadvantage that its sensor fiber is not flexible. The sensor coil therefore does not have a variable shape, but a fixed, predetermined shape. The sensor cannot be fitted for measurement of an electric current flowing in a current conductor without opening the current conductor. If the coil diameter is large, a fixed coil shape is also disadvantageous for transport and installation. If the coil of a sensor such as this were designed to be flexible, this could have a disadvantageous effect on its accuracy. Stable measurement sensitivity would not be ensured.

Furthermore, JP 2001-083187 and JP 2000-121675 disclose a fiber-optic current sensor and a corresponding sensor head which allows a sensor coil loop to be arranged around a current conductor without having to interrupt the current conductor. For this purpose, a sensor fiber of the sensor is attached at both of its ends to a respective rigid semicircular frame piece, with the two frame pieces being connected to one another by a hinge and, when in the closed state, forming a ring on whose outer face the sensor fiber runs. Measurements with an accuracy in the one in a thousand range are not possible with a sensor such as this, and it is more difficult to transport and install the sensor head in confined spatial conditions.

SUMMARY

A sensor head and a current or magnetic-field sensor are disclosed. Exemplary embodiments allow a largely temperature-independent and accurate current or magnetic-field measurement with a sensor head which can be installed to allow measurements to be carried out with large sensor coil diameters as are used, for example, for measurement of currents in current conductors with a large cross section.

In exemplary embodiments, high measurement accuracy can be achieved even when the sensor coil is repeatedly removed and refitted, and without this requiring renewed calibration of the sensor. An exemplary aim is for it to be possible to calibrate the sensor during production (of the sensor coil or of the sensor), then to change the sensor fiber to a different shape, and then to install it at the usage location once again forming a coil without any need to recalibrate the sensor.

The sensor and the sensor coil can be fit around a current conductor without having to open the current conductor.

BRIEF DESCRIPTION OF THE DRAWINGS

The subject matter of the invention will be explained in more detail in the following text using preferred exemplary embodiments, which are illustrated in the attached drawings, in which is shown in.

The reference symbols used in the drawings and their meanings are listed in summarized form in the list of reference symbols. In principle, identical parts or parts having the same function are designated with the same reference symbols in the figures. The described exemplary embodiments represent exemplary embodiments and have no restrictive effect.

DETAILED DESCRIPTION

An exemplary fiber-optic sensor head is disclosed for a current or magnetic-field sensor having an optical fiber which includes a magnetooptically active sensor fiber which is optically connected to at least one polarization-defining element, wherein the sensor fiber can be arranged in the form of a coil around a conductor which carries the current to be measured or in a magnetic field to be measured, with the coil defining a coil plane with a surface normal, and with the at least one polarization-defining element having a marked or preferred axis.

The sensor head can be bendable (flexible) in the area of the sensor fiber, and an adjustment means can be provided for adjustment of a predeterminable angle $\beta$ between the marked axis and the surface normal or for adjustments of predeterminable angles $\beta$, $\beta'$ between the marked axes and the surface normal. When there are two polarization-defining elements, the angle between a marked axis of one polarization-defining element and the surface normal is $\beta$, and the angle between a marked axis of the other polarization-defining element and the surface normal is $\beta'$.

The sensor fiber can be a fiber which has not been thermally treated at least the softening temperature of the sensor fiber material. The sensor fiber can thus remain in a particularly flexible state, thus making it considerably easier to produce sensor heads for large-diameter coils, and to install the sensor head.

The fiber coating can be removed from the sensor fiber. Where the fiber coating has been removed from the sensor fiber, the induction of undesirable birefringence as a result of mechanical forces, which in general occur in the event of temperature changes and which the fiber coating exerts on the fiber, can be reduced or avoided. This is because, in general, the thermal coefficients of expansion of the fiber coating and cladding are different. Such disturbing birefringences typically can lead to measurement inaccuracies of 1% to 2% or more.

In this case, the term coil does not mean that the coil need necessarily have one or more closed turns or that it must necessarily have round turns or turns arranged in a spiral shape.

These features can be advantageous in the case of a current sensor. However, in the case of an exemplary magnetic-field sensor, the coil need be not closed; in fact, the sensor fiber can extend in a rather elongated form along the magnetic field. Even in a situation such as this, it is herewith said that the sensor fiber is arranged to form a coil. If, for example, the fiber is arranged in the form of a segment of a circle, the coil plane is defined as that plane which contains this circle segment. In the case that the sensor fiber is arranged in a perfectly linear form (without being curved), it does not form a coil, and no coil plane is defined either.

Exemplary inventive considerations have resulted in an exemplary angle $\beta$ or angles $\beta$, $\beta'$, which defines or define the azimuth orientation of the polarization-defining element with respect to the coil plane, having a small influence on the calibration. This can be in the parts per thousand range, but may even be in the parts per hundred range. The angle $\beta$ or the angles $\beta$, $\beta'$, respectively, can be taken into account for high-precision Measurements. Exemplary inventive considerations which have led to Identification of the relevance of the angle $\beta$ or of the angles $\beta$, $\beta'$ are described further below.

In general, an exemplary sensor provides a measurement signal which is proportional to a phase shift which is dependent on a measurement variable. Calibration essentially means that a constant factor (calibration factor) is looked for and is set, so that a predeterminable current (for example 1 kA) or a predeterminable magnetic field produces a desired output signal (for example 1 scale division or 1 V). If a change in the calibration factor occurs before or during the fixing or fitting of the sensor head, then this can adversely affect the measurement accuracy of the sensor, and recalibration is indicated.

An exemplary sensor head is in general provided either for a sensor using a reflection configuration or a sensor using a Sagnac configuration. In the former case, mirroring is provided at one end of the sensor fiber, while the other end is provided with a polarizer, or a phase-delay element, or a polarization-maintaining supply fiber. The polarizer, the phase-delay element or the supply fiber, respectively, defines the polarization state of the light which enters the sensor fiber. They are thus used as polarization-defining elements. The angle between the surface normal of the coil plane and the marked axis of the polarization-defining element (for the polarizer: the axis along the transmission direction; for the phased-delay element or a polarization-maintaining supply fiber: one of the principal axes, for example the slow principal axis) is $\beta$.

In the case of a polarization-maintaining supply fiber or of a fiber-optic polarizer, the axis directions or the pass direction immediately before the phase-delay element or before the sensor fiber can be the deciding factor, because the supply fiber or a fiber polarizer could be twisted, so that the axis directions vary along the fiber.

In the Sagnac configuration, both ends of the sensor fiber can be each provided with one such polarization-defining element, so that this results in two angles $\beta$, $\beta'$, which may also be chosen to be of different magnitudes. In the case of a sensor in the Sagnac configuration, a splicing or plugging-in process can be carried out during installation if the sensor head is intended to be fitted without having to open the conductor.

Advantageously, a mechanical apparatus for fixing the angle $\beta$ or the two angles $\beta$, $\beta'$ can be used as the adjustment means.

The sensor fiber can be highly advantageously arranged in a capillary. The capillary provides mechanical protection for the fiber, from which the fiber coating has been removed, and prevents external forces from acting on the fiber.

The adjustment means can be advantageously provided in order to achieve reproducibility of overall birefringence of the sensor fiber (the adjustment means can be used to set the angle $\beta$ reproducibly or to set the angles $\beta$, $\beta$ reproducibly ') when the sensor fiber is changed to a different shape between calibration of the current or magnetic-field sensor and installation of the coil at a usage location.

In practice, this overall birefringence can be made up essentially of the following contributions:

bending-induced birefringence, intrinsic birefringence as a result of internal stress in the sensor fiber and as a result of the fiber core of the sensor fiber not having a perfectly rotationally symmetrical shape, stress at fiber splices in the sensor head, and birefringence resulting from the fact that the sensor fiber is not precisely linear but has initial curvature in an unstressed state.

The occurrence of these birefringence contributions, which can influence a measurement signal in the parts per thousand or parts per hundred range, can be difficult to avoid, but their joint influence on a measurement signal can be reproduced in the case of an exemplary sensor described herein. In one advantageous embodiment, the adjustment means contains a mount body, to which the at least one polarization-defining element is fixed.

The mount body can be a flexibly deformable mount body. This can have the advantage that its shape (and thus the shape of the sensor head) can be adapted to external conditions (available space, predetermined geometry at the usage location), allows easy installation and can be transported easily and in a space-saving manner.

The mount body can be configured in such a manner that through it and through the fixing of the polarization-defining element the at least one angle $\beta$ is defined.

The mount body can be configured in such a manner that through it and through the fixing of the polarization-defining element to it the relative position of the marked axis or axes with respect to the coil plane is defined. The mount body can predetermine the shape of the coil.

In an exemplary embodiment, the sensor fiber extends along a longitudinal axis of the mount body. In consequence, the shape of the coil is predetermined by the shape of the mount body. An exemplary bending direction of the mount body can be predetermined at right angles to the longitudinal axis. If the mount body is flexible, this makes it possible to predetermine the way in which the mount body can be shaped in the form of a coil. The mount body can be flexible (at least for one marked or preferred bending direction). The shape of the coil can then also be matched to the shape of a housing.

In an exemplary embodiment, when the mount body is bent in a bending direction, the sensor fiber can be arranged on or close to the neutral plane of the mount body. This can minimize mechanical stress, which the sensor fiber experiences during the shaping of the coil by bending of the mount body. This can lead to greater measurement accuracy and calibration stability of a sensor which uses the sensor head for measurement.

It can be advantageous in an exemplary embodiment for the angle β or the angles β, β' to be chosen as a function
of the intrinsic birefringence of the sensor fiber and birefringence at splices,
of bending-induced birefringence, and
of birefringence resulting from initial curvature of the sensor fiber, in such a manner that
the influence of changes in the bending-induced birefringence or
the influence of changes in the angle β or in the angles β,β' on measurement signals, which can be produced by a current or magnetic-field sensor with the sensor head 2, is minimal.

It has been found that such a choice of appropriate specific angles β is possible. The mentioned birefringences can be determined; in addition, for example, a corresponding measurement signal, for example a normalized signal, can be calculated as a function of the angle β by means of Jones matrixes. This results in the sought angle β. The measurement signal is obtained from the phase shift which the light experiences as it propagates in the sensor head during a measurement, and can be essentially proportional to the current or magnetic field to be measured.

In an exemplary embodiment, the sensor fiber is arranged essentially on the coil plane. In this case (in the case of a reflective interferometric sensor), the polarization-defining element is a polarization-maintaining supply fiber, with a phase-delay element being arranged between the polarization-maintaining supply fiber and the sensor fiber and having a phase-delay angle which differs from the phase-delay angle of an ideal phase-delay element by an angle ϵ other than zero, and with the angle β being chosen to be β=0°±n×90° or β=45°±n×90°, wherein n is a positive integer or is zero; or (in the case of an interferometric sensor using the Sagnac configuration), the polarization-defining elements are two supply fibers with a phase-delay element in each case being arranged between the supply fibers and the sensor fiber, and with at least one of the two phase-delay elements having a phase-delay angle which differs from the phase-delay angle of an ideal phase-delay element by an angle ϵ other than zero, and with the angles β, β' being chosen to be β=β'=0°±n×90° or β=β'=45°±n×90°, wherein n is a positive integer or is zero.

The angle ϵ differing from zero can be chosen in order to achieve intrinsic temperature compensation for the sensor. In the case of the Sagnac configuration, the supply fibers can be polarization-maintaining fibers; however, they may also be of a different fiber type, for example single-mode, and then in each case still have a polarizer, by means of which the marked direction of the polarization-defining element is defined.

The choice of the angle β or of the angles β, β' as 0°±n×90° can make it possible to minimize the influence which changes in the coil shape have on the sensor accuracy and the calibration, since the influence of changes in the bending-induced birefringence can have a minimal influence on a measurement signal.

The choice of the angle β or of the angles β, β' as 45°±n×90° can make it possible to minimize the influence of changes in the angles β, β' on measurement signals. This minimum can also be achieved by different combinations of the angles β and β', in which β and β' differ from one another.

The advantages of choosing the angle β or the angles β, β' as 0°±n×90° or 45°±n×90° can be achieved provided that the intrinsic birefringence is not larger than the bending-induced birefringence.

In an exemplary embodiment markings are provided, and are fitted to the adjustment means in such a manner that the coil has an integer number of turns when the markings are arranged in a suitable manner with respect to one another. This allows in a simple manner an accurate current measurement, which is largely insensitive to disturbances. The two ends of the sensor fiber can be arranged very close to one another. On the one hand, a current measurement with an integer number of coil turns is highly insensitive to the current conductor position within the coil, and on the other hand the influence of currents which flow through a conductor that is not passed through the coil, and the influence of other disturbance fields, are negligibly small. This is particularly important, by way of example, when the aim is to measure the current in one or more of a plurality of adjacent current conductors.

Markings such as these can be fitted in the immediate vicinity of the two ends of the sensor fiber, or close to the two ends of the sensor fiber, or at least spaced apart by the length of the sensor fiber. By way of example, holes may be used as markings such as these.

Such markings can also be provided on an adjustment means such as this which is not an adjustment means for adjustment of a predeterminable angle β between the marked axis and the surface normal or for adjustment of predeterminable angles β, β' between the marked axes and the surface normals. The adjustment means is then an adjustment means for adjustment of an integer number of turns.

The capillary and/or the sensor fiber can be advantageously composed essentially of quartz glass.

An exemplary current or magnetic-field sensor contains a sensor head as described herein, and can have the corresponding advantages. Such a sensor may advantageously be:
a) an interferometric sensor in a reflection configuration with a polarization-maintaining supply fiber as the one polarization-defining element, and with one marked axis being the fast or the slow principal axis of the supply fiber, or
b) an interferometric sensor in the Sagnac configuration with two polarization-maintaining supply fibers as polarization-defining elements, and with the two marked axes being the fast or the slow principal axes (or each being a fast and a slow principal axis) of the two supply fibers, or
c) a polarimetric sensor in a reflection configuration with a polarizer as the polarization-defining element or with a polarization-maintaining supply fiber as the polarization-defining element, with one marked axis running along the transmission direction of the polarizer or along a principal axis of the polarization-maintaining supply fiber, respectively, or
d) a polarimetric sensor in the Sagnac configuration with two polarizers as polarization-defining elements or with two polarization-maintaining supply fibers as polarization-defining elements, and with the two marked axes running along the transmission directions of the two polarizers or along the principal axes of the polarization-maintaining supply fibers, respectively.

In cases a) and b), a phase-delay element which is optically connected to the sensor fiber, or else two phase-delay elements which are optically connected to in each case one end of the sensor fiber may also be used as the polarization-defining element or as the polarization-defining elements.

In case b), at least one of the two polarization-maintaining supply fibers may be replaced by a different type of fiber, for example a single-mode fiber, and a polarizer. The pass direction of the polarizer then indicates the marked direction.

An exemplary high-voltage installation has at least one sensor head or a current sensor. For example, the high-voltage installation may be an advantageously three-pole high-voltage switchgear assembly, for example of a gas-insulated or air-insulated type.

An exemplary method for production of a sensor head for an optical current or magnetic-field sensor, in which a magnetooptically active sensor fiber, which is optically connected to at least one polarization-defining element, is arranged in the form of a coil, with a fiber, which has not been thermally treated at at least the softening temperature of the sensor fiber material, being used as the sensor fiber, with the coil defining a coil plane with a surface normal, with the polarization-defining element having a marked axis, with the current or magnetic-field sensor which is provided with the coiled sensor fiber being calibrated, and with the sensor head being provided with an adjustment means through which, when the sensor fiber is arranged in the form of a coil again, the angle β between the marked axis of the polarization-defining element and the surface normal can be adjusted to be of the same magnitude as during the calibration, wherein a sensor fiber from which the fiber coating has been removed can be used.

A sensor head produced in this way can have the advantage that it allows very accurate measurements to be carried out without any need for recalibration after deformation of the sensor coil. A sensor head such as this is calibrated in advance, and can be installed easily at the usage location.

Figure 1:
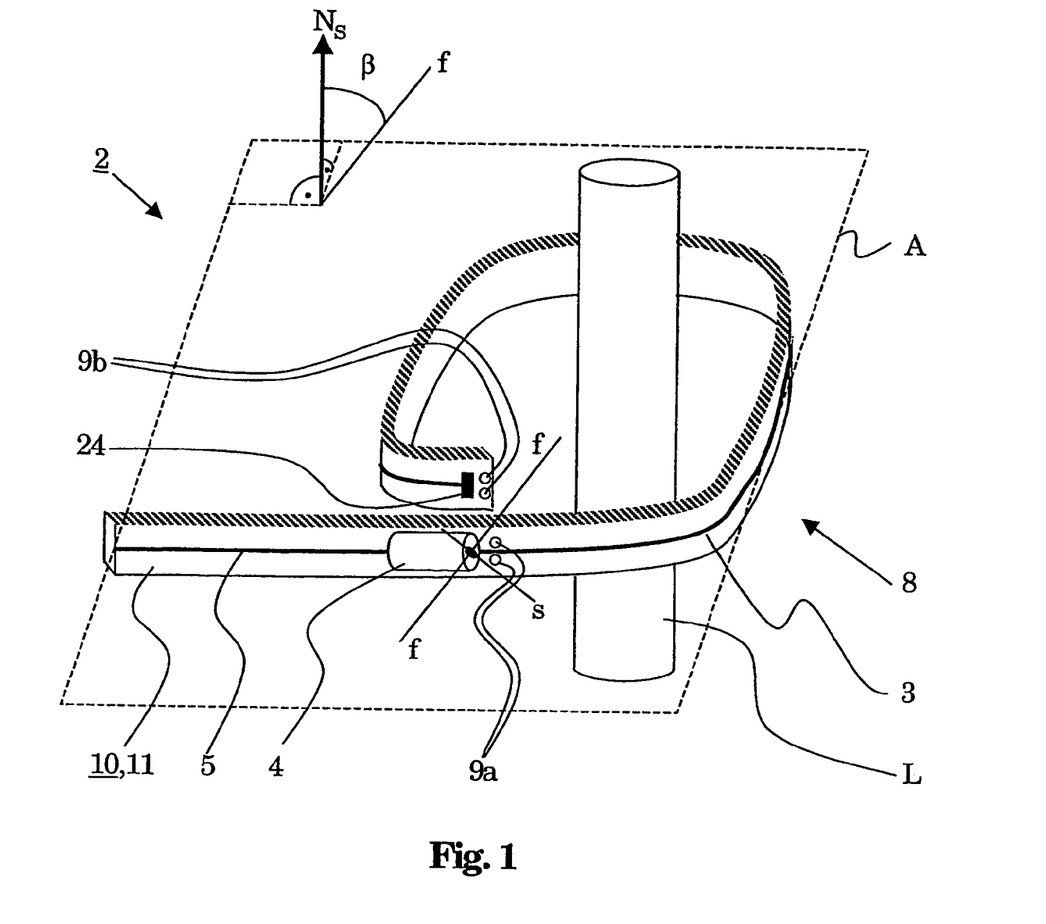
FIG. 1 shows an exemplary sensor head.

FIG. 1 shows schematically an exemplary sensor head 2 in a reflection configuration. A polarization-maintaining supply fiber 5 is used to connect the sensor head 2 to an optoelectronic module which is not illustrated. Light which is injected through the supply fiber 5 first of all enters a fiber-optic phase-delay element 4, which is illustrated in an enlarged form and is used to produce circular or elliptical polarization. The phase-delay element 4 is provided at one end of a sensor fiber 3, which is arranged in the form of a coil 8 with one turn around a conductor L. The other end of the sensor fiber 3 is mirrored or is provided with a mirror 24. The sensor fiber 3 advantageously has nominally very low birefringence. It has a Verdet constant so that the Faraday effect makes it possible to achieve a non-reciprocal phase shift of light waves propagating in the sensor fiber 3.

The optical fibers 3, 4, 5 are fixed to a mount body 11 which is used as the adjustment means 10. A strip composed of glass-fiber-reinforced plastic is used as the mount body 11.

The coil 8, which advantageously has an integer number of turns, defines a coil plane A which has a surface normal $N_s$. The coil 8 may also have a plurality of turns, and in particular it may have a plurality of turns (also including a non-integer number of turns) in a shape like a spiral or like helical turns. A coil plane A can always be defined.

The phase-delay element 4, which in this case acts as a polarization-defining element 4, has a fast principal axis f and a slow principal axis s as two marked axes. The angle formed by the surface normal $N_s$ and the fast axis f is in this case referred to as the angle β.

The phase-delay element 4 is attached to the plastic strip 11, so that its position and angular orientation with respect to the corresponding area of the plastic strip 11 are fixed.

The geometry of the cross section of the mount body 11 predetermines the radial direction along which the plastic strip 11 can preferably be bent (preferably because this involves relatively little force being applied), so that the relative position of the coil plane A with respect to the fast axis f is predetermined. In consequence, the angle β is predetermined. It is also feasible for the mount body to be manufactured from non-isotropic materials or from material combinations so that the bending direction is produced by the material rather than by the cross-sectional geometry.

In addition, two markings 9a, 9b, each in the form of two holes, are also provided on the mount body. The two ends of the sensor fiber can be arranged in immediate vicinity of one another in a defined manner by means of these holes 9a, 9b, thus resulting in a virtually perfectly closed coil 8 with an integer number of turns. In order to illustrate this more clearly, FIG. 1 shows the two sensor fiber ends at a distance from one another.

During the production of the sensor head 2, a sensor comprising the sensor head 2 and an optoelectronic module can be calibrated, during which process an angle β can be predetermined. The sensor head 2 can then be arranged in a different way, for example being rolled up more tightly for transport purposes, and can be arranged in the same way or in a different way at a usage location of the sensor as during the calibration. However, the angle β can once again be chosen by the adjustment means 10 to be precisely of the same magnitude as during the calibration, so that there is no need for recalibration of the sensor at the usage location in order to achieve high measurement accuracy. To this extent, the adjustment means 10 allows the angle β to be set reproducibly.

Figure 2:
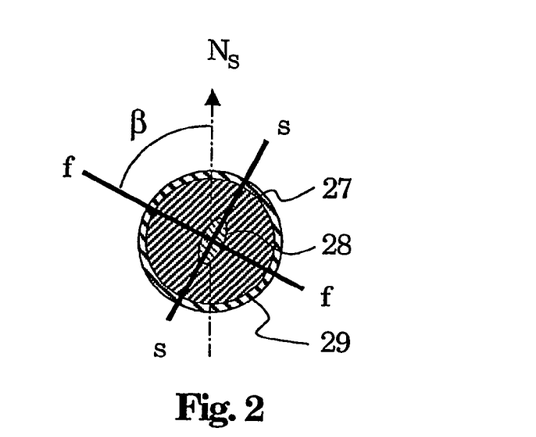
FIG. 2 shows a definition of an angle $\beta$ for a fiber having an elliptical core cross section.

FIG. 2 shows schematically the definition of the angle β for an exemplary fiber with an elliptical core cross section. This fiber may be a supply fiber 5 or a fiber-optic phase-delay element 4. The fiber cladding 27 is arranged around the fiber core 28, which defines the position of the principal axes s, f. The fiber also has a fiber coating 29, which surrounds the fiber cladding 27.

The sensor fiber 3 advantageously has no such fiber coating 29.

Fixing of the azimuth orientation of the polarization-defining element 4 with respect to the coil plane A is advantageous for the following reasons:

In the case of a reflective interferometric sensor, the phase shift $\Delta\phi_R$ induced by a current I to be measured in the sensor fiber 3 between left-hand and right-hand circular-polarized light waves propagating in the sensor fiber 3 is:

$$\Delta\phi_R = 4\phi_F = 4VNI,$$

wherein $\phi_F$ is the Faraday phase shift V•N•I with V the Verdet constant of the sensor fiber, N the number of turns of the coil and I the current. In this case, the phase-delay element 4 is assumed to be a λ/4 element, with the principle axes of birefringence of the phase-delay element 4 forming an angle of 45° with the principle axes of birefringence of the supply fiber 5. The above equation is precisely true only when the sensor fiber 3 has no birefringence whatsoever.

However, slight birefringence occurs even in the case of fibers 3 which nominally have very little birefringence.

In practice, exemplary contributions to the non-negligible birefringence are as follows:

(1) bending-induced birefringence,
(2) intrinsic birefringence as a result of internal stress in the fiber and as a result of the fiber core of the sensor fiber 3 not having a perfectly rotationally symmetrical shape,
(3) stress at fiber splices, for example between the λ/4 element 4 and the sensor fiber 3, (4) birefringence resulting from the fact that the sensor fiber 3 is not precisely linear but has initial curvature in an unstressed state, as a result of which rotation of the fiber 3, which is arranged in the form of a coil, about its, own axis leads to birefringence changes.

In the event of a change in the angle β, the axes for the contributions (2) and (3) can change by the same angle. However, in exemplary embodiments, the principle axes of birefringence for the contribution (1) always remain parallel or at right angles, respectively, to the bending direction. The overall birefringence thus changes when the angle β, that is to say the azimuth orientation of the fiber 3a, is changed.

The contribution (4) is generally less than the other contributions, or else zero. The fact that this contribution (4) is likewise dependent on the angle β results from its nature.

Taking into account the existence of the birefringence, a description of the light propagation with the aid of Jones matrixes results in more accurate values of the phase shift $\Delta\phi_R$, which is induced by a current I to be measured in the sensor fiber 3, between left-hand and right-hand circular-polarized light waves propagating in the sensor fiber 3 (reflective interferometric sensor):

$$\Delta\phi_R = 4\phi_F \cdot (1 + (1/3) \cdot \delta^2),$$

wherein 67 is the total birefringence phase shift in the sensor fiber 3. Taking into account the individual terms and ,-dependencies of the contributions (1) to (4), this results in:

$$\Delta\phi_R = 4\phi_F \{1 + (1/3)[\delta_b^2 + \delta_0^2 + (1/2)\delta_1^2] + (2/3)[\delta_b\delta_0 + (1/4)\delta_1^2] \cos(2\beta) + (1/3)[(\delta_b + 2\delta_0)\cos\beta + \delta_b\cos(3\beta)]\delta_1\}$$

with the following abbreviations:
$\delta_b$: birefringence phase shift resulting from contribution (1), that is to say bending-induced;
$\delta_0$: birefringence phase shift resulting from contributions (2) and (3), that is to say from intrinsic birefringence and birefringence at splices;
$\delta_1$: birefringence phase shift resulting from contribution (4).

Analogous considerations apply to the case of the Sagnac configuration and to the case of polarimetric sensors.

Figure 3:
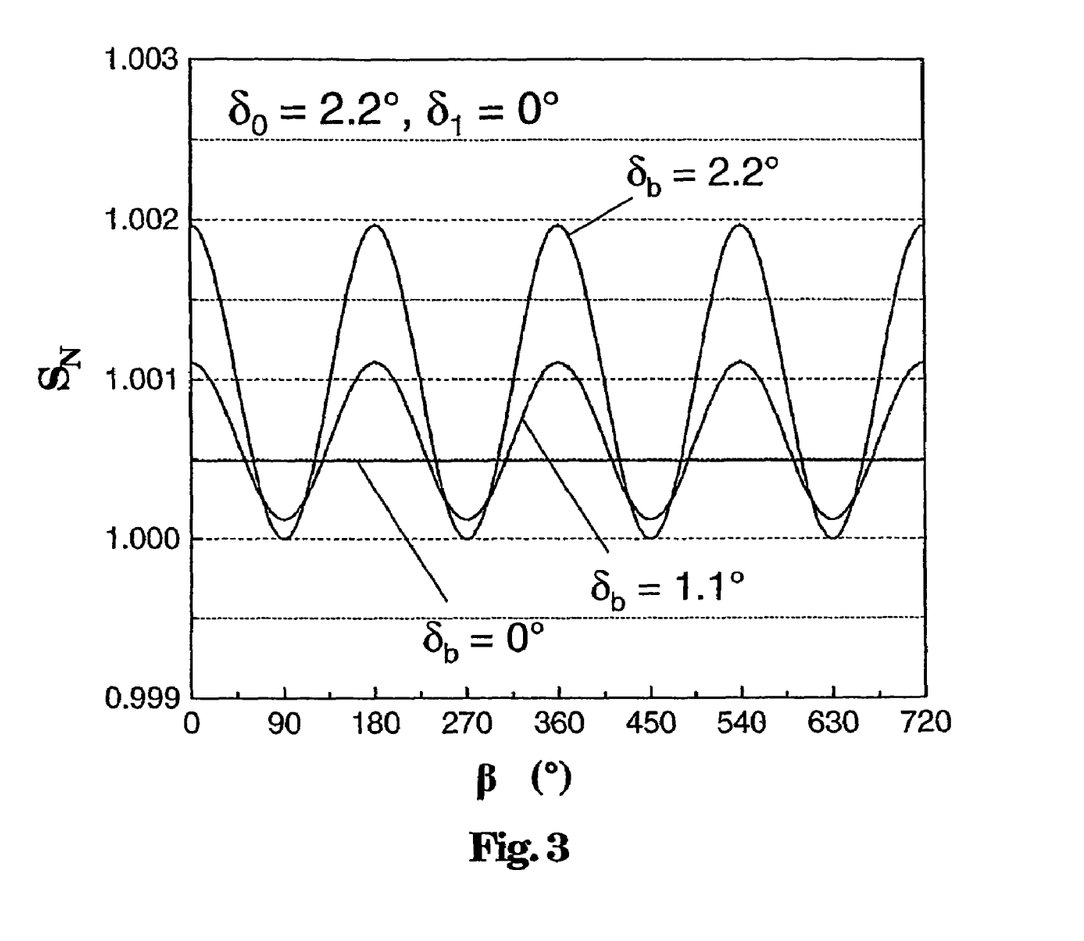
FIG. 3 shows an illustration of a calculated relationship between a normalized signal and the angle $\beta$.

FIG. 3 shows an illustration of a calculated relationship between a normalized signal $S_N$ and the angle β, once again for a reflective interferometric sensor. The polarization-maintaining supply fiber 5, which in this case is considered to be the polarization-defining element 5, has a fast and a slow principal axis as two marked axes. The angle which is formed by the surface normal $N_s$ and the fast axis is in this case referred to as the angle β for the calculations in FIGS. 3 and 4. These calculations are also based on the assumption that the sensor fiber is arranged essentially in the coil plane.

The normalized signal is defined as:

$$S_N = \Delta\phi_R / 4\phi_F.$$

$S_N$ is illustrated in FIG. 3 for $\delta_0 = 2.2°$ and $\delta_1 = 0°$ and the values of 0°, 1.1° and 2.2° for $\delta_b$. $S_N$ varies in the range up to ±1 or ±2 per thousand. The value $\delta_b = 1.1°$ corresponds to the bending-induced birefringence in the case of an originally linearly extending quartz fiber which is wound to form a coil with one turn and a coil diameter of 1 m, with a fiber diameter of 80 μm. The calculation in FIG. 3 has been based on the assumption that the phase-delay element 4 is a perfect λ/4 element, that is to say produces a phase delay of precisely 90°.

In order to achieve intrinsic temperature compensation a phase-delay element 4 can be used, which produces a different phase-delay angle of 90°+ε. Further details relating to temperature compensation can be found in European Patent Application EP 1 115 000 or International Laid-Open Specification WO 03/071290 A1, the entire disclosure content of both these documents being hereby incorporated by reference in their entireties herein. In the case of such a temperature compensation, the angle between the principle axes of the supply fiber and of the phase-delay element may advantageously also be chosen to be other than 45°.

Figure 4:
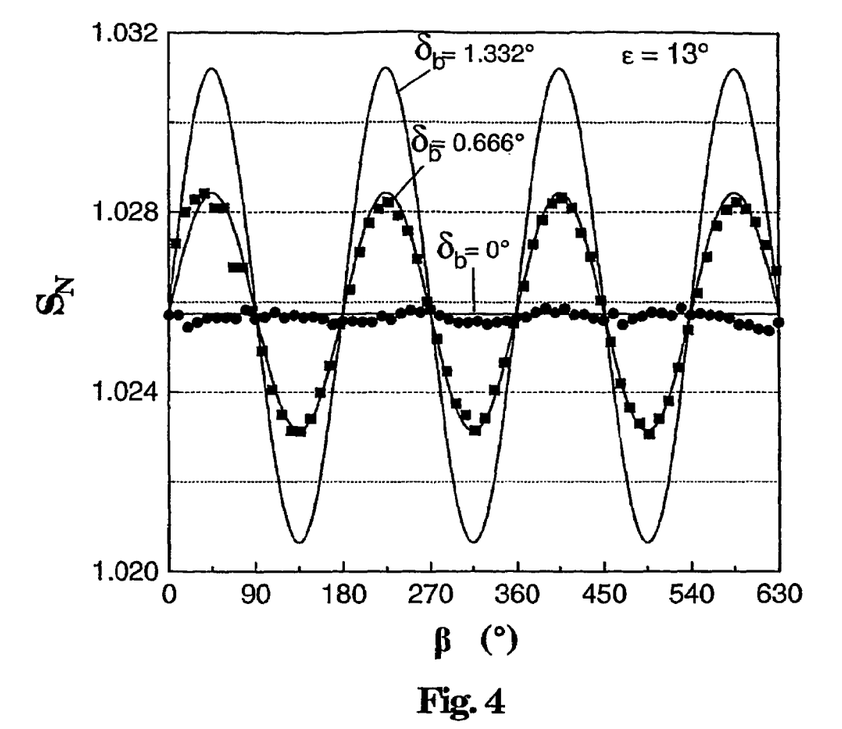
FIG. 4 shows an illustration of a calculated relationship between a normalized signal and the angle $\beta$, and corresponding experimentally determined values.

Taking into account a non-negligible angle ε this results in the values of the normalized signal $S_N$ as illustrated in FIG. 4 as a function of the angle β for the case with $\delta_0 = 0°$ and $\delta_1 = 0°$, and $\delta_b$ values of 0°, 0.660° and 1.332°, that is to say for the situation in which all of the birefringence is bending-induced. The solid lines are calculated values, and the circles and squares are experimentally determined values. The case of ε=13° has been considered. A fiber with a diameter of 80 μm and a coil radius of 0.821 m has been investigated for the situation in which $\delta_b = 0.666°$. As can be seen from FIG. 4, fluctuations of several percent can occur if the angle β is ignored.

The following equations, which have likewise been derived using Jones formalism, are used as the basis for the calculated curves in FIG. 4:

$$\Delta\phi_R = const \times \tan \frac{-2(T'_{12}/T''_{12})}{1 - 2(T'_{12}/T''_{12})^2} \text{ wherein}$$

$$\frac{T'_{12}}{T''_{12}} = \frac{-2\varphi_F \frac{\tan\Gamma}{\Gamma}}{\cos\varepsilon - \delta_b \frac{\tan\Gamma}{\Gamma} \sin(\varepsilon)\sin(2\beta)} \text{ and}$$

$$\Gamma = [\delta_b^2 + (2\varphi_F)^2]^{1/2}.$$

Figure 5:
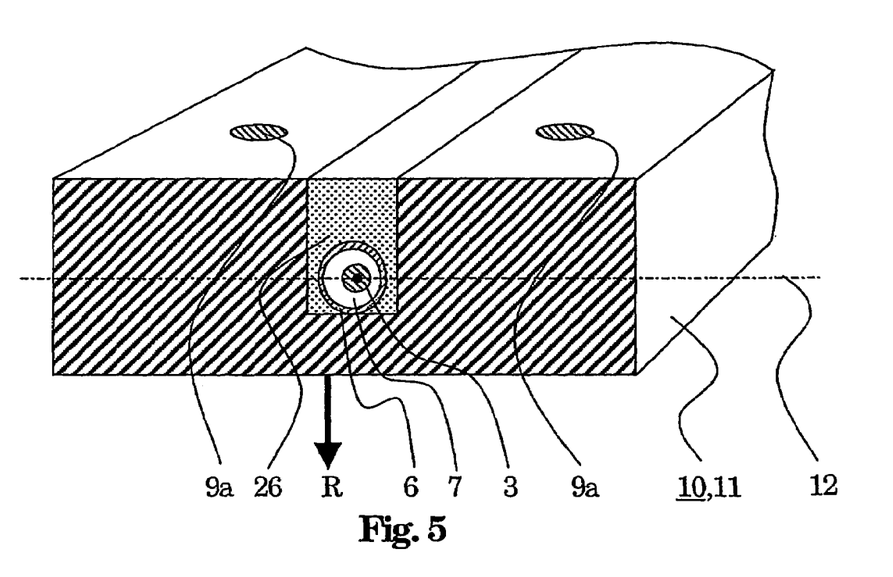
FIG. 5 shows schematically a section through an exemplary sensor head in an area of the sensor fiber.

FIG. 5 shows schematically a section through an exemplary sensor head in the area of the sensor fiber 3. With its fiber coating removed, the sensor fiber 3 is mounted in a capillary, which also contains a friction-reducing means 7, for example silicone oil. The friction-reducing means 7 minimizes friction forces between the sensor fiber 3 and the capillary 6.

The capillary 6 is arranged in a groove which extends along a longitudinal axis of the plastic strip 11, which acts as the mount body 11. The capillary 6 is mounted in the groove by means of silicone 26. It can be attached along the entire sensor fiber 3, or at discrete points. The attachment prevents the capillary 6 from twisting in the groove.

The capillary 6 is arranged in the neutral plane 12 of the mount body 11 in order to minimize mechanical stress in the capillary 6 and in the sensor fiber 3 during bending of the mount body 11. This ensures that the sensor fiber 3 is arranged close to the neutral plane 12 of the mount body 11. The capillary 6 may also advantageously have a capillary coating. This prevents microscopic cracks which occur on the surface of the capillary if the sensor head is bent frequently. Such microscopic cracks can lead to fracture of the capillary.

If the sensor fiber 3 is arranged without any capillary on the strip 11 composed of glass-fiber-reinforced plastic, the sensor fiber is itself advantageously arranged in the neutral plane 12 of the mount body 11.

Since the sensor fiber 3 extends along the adjustment means 10, the shape of the coil can be predetermined by the adjustment means 10. This once again makes it possible to minimize changes in the bending-induced birefringence when the coil is opened and closed again. See also the contribution (1) above.

It is also possible to provide an adjustment means 10 which, for example, has two pieces which are arranged close to the ends of the sensor fiber 3 and can be oriented with respect to one another, for example by means of a plug-in or clamping apparatus, while the shape of the central part of the sensor fiber 3 is not governed by the adjustment means 10. A third piece of the adjustment means is in this case used to predefine the coil plane relative to the two other pieces. By way of example, the third piece could be a housing which predefines the coil plane but does not significantly restrict the shape of the turns within the coil plane.

It is also possible for a third piece such as this to be a housing which predefines the shape of the coil within a coil plane which is predetermined by a plastic strip 11 as the mount element.

In such cases, that is to say when differing coil shapes have to be provided, the contribution (4) of the bending-induced birefringence can vary considerably between the calibration and the installation of the sensor head at the usage location. That is to say, if varying coil shapes are provided, it can be highly advantageous to choose an angle $\beta$ of $\beta=0°\pm n\times 90°$ for a configuration as described in conjunction with FIG. 4, wherein n is a positive integer or zero. As can be seen from FIG. 4, the influence of the bending-induced birefringence on the measurement signal and on the calibration is then minimal.

However, if the shape of the coil is known and is identical during calibration and at the usage location, for example because a mount body with complete fixation of the capillary 6 or the sensor fiber 3 is used, it can be highly advantageous to choose an angle $\beta$ of $\beta=45°\pm n\times 90°$ for a configuration as described in conjunction with FIG. 4, in order to minimize the influence of non-perfect fixings of the angle $\beta$. As can be seen from FIG. 4, the influence of $\delta$ on the normalized signal $S_N$ is minimal, when $\delta$ is chosen to be $\beta=45°\pm n\times 90°$.

As can be seen from FIG. 3, an optimum angle $\beta$ (or $\beta$ and $\beta'$) for the intended application can be calculated for the situation in which the phase-delay element does not have a phase-delay angle which differs from an ideal phase-delay element (that is to say $\epsilon=0°$).

In order to fix the angle $\beta$, it is either possible to attach the phase-delay element and/or the supply fiber directly to the mount body 11 or to attach the phase-delay element and/or the supply fiber to the capillary 6, which is in turn attached to the mount body 11 (for example by means of the silicone 26). A part of the at least one supply fiber can also advantageously be arranged within the capillary 6.

The shape of the cross section of the mount body 11 predetermines a preferred bending direction R (radial direction) of the mount body 11. The opposite direction to this direction R is likewise a preferred bending direction of the mount body 11. Other directions can involve a considerably greater force being associated with bending of the mount body along a direction such as this (to the same radius).

The cross section of the mount body 11 may, for example, be 10 mm×2.5 mm. Further, advantageously non-rotationally symmetrical, cross sections, for example elliptical cross sections, are feasible.

Instead of epoxy materials for the mount body, a large number of other materials can be used, even including non-ferromagnetic metals. In the case of metals, care must be taken to ensure that the sensor fiber is not radially completely surrounded by metal since, otherwise, eddy currents would shield the magnetic field to be measured. This can be particularly important when, for example, the aim is to measure AC currents or currents with an AC component, or magnetic alternating fields, respectively.

Two holes 9a are provided on the mount body 11 and are located close to one end of the sensor fiber 3. At least one further marking can then be provided at that end of the sensor fiber 3 which is not illustrated, for example likewise holes or matching pins, which simplifies the arrangement of the sensor fiber 3 to form a coil with an integer number of turns, with the sensor fiber ends being arranged close to one another. Other markings, such as optical or mechanical markings, can also be used as markings. The corresponding sections of the mount body 11 can then overlap one another or be arranged alongside one another and can be held together (fixed to one another) by means of a screw connection or by means of brackets or a similar holding apparatus. The holes 9a can also be used to fix the mount body 11 to a housing. The shape of the coil can also be predetermined by an external housing rather than by the adjustment means. The adjustment means defines the angular orientation and not necessarily also the shape of the coil. If the coil turn or turns is or are chosen to be circular, the influence of bending-induced birefringence is minimal.

Figure 6:
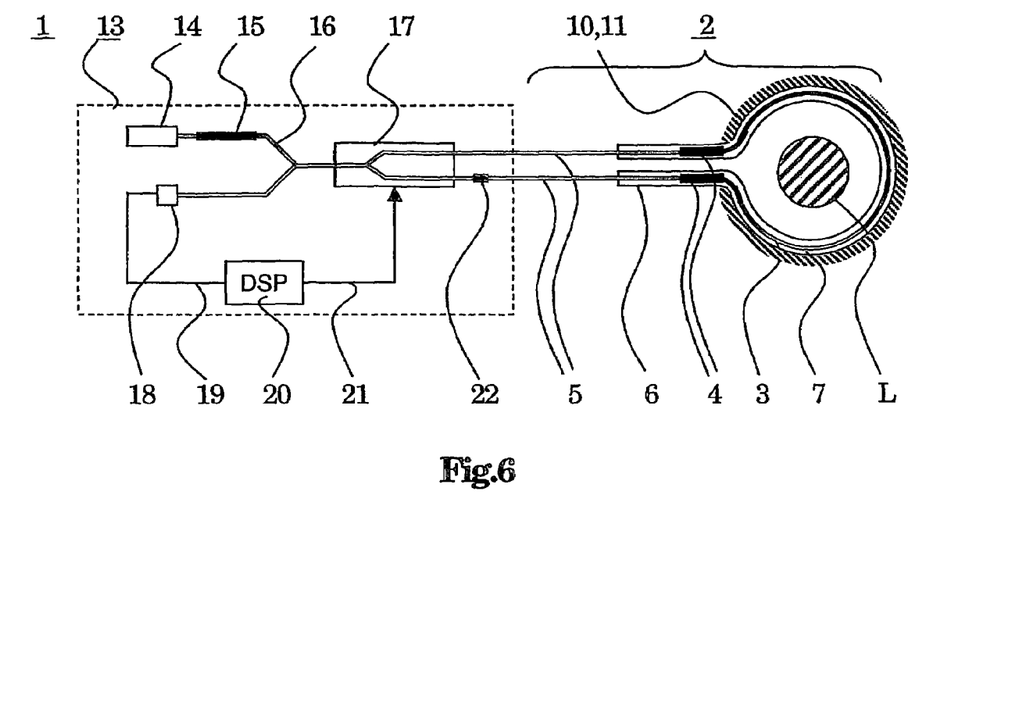
FIG. 6 shows schematically a configuration of an exemplary interferometric sensor in Sagnac configuration.

FIG. 6 shows schematically one possible exemplary configuration of an interferometric sensor 1 in Sagnac configuration. Two supply fibers 5 connect the sensor head 2 to an optoelectronic module 13, which is used for light generation and detection and for evaluation. The meaning of the reference symbols can be found in the list of reference symbols. In order to explain FIG. 6, reference is made to the patent application submitted to the European Patent Office on Sep. 3, 2003, with the application number EP 03405641.6 and from the same applicant, the disclosure of which is hereby incorporated by reference in its entirety. Except for the adjustment means 10, FIG. 1 therein corresponds essentially to the present FIG. 6. Reference is made to the associated figure description (page 10, last paragraph to page 14 first paragraph of the cited patent application with the application number EP 03405641.6, in the filed version) for an explanation of the sensor design and its operation, and this reference is hereby expressly included in the disclosure content.

Figure 7:
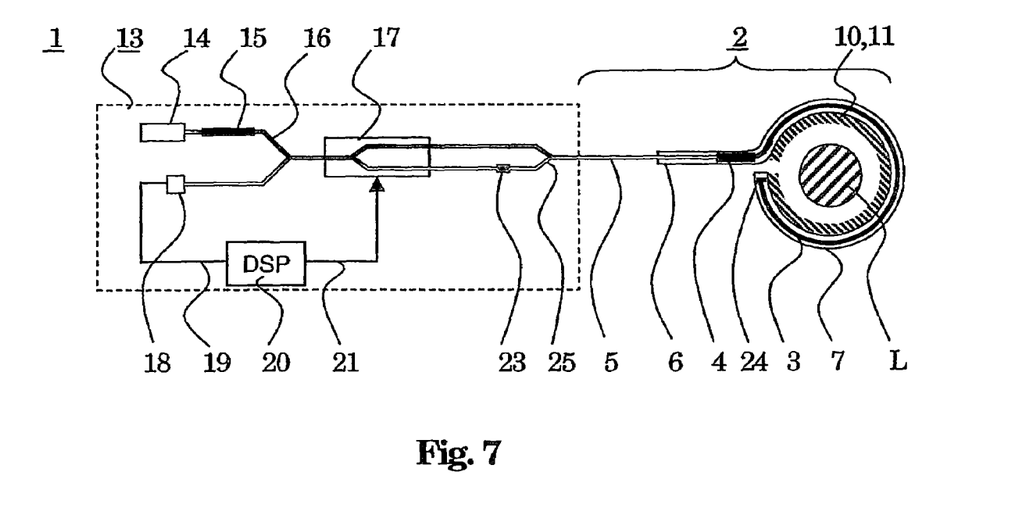
FIG. 7 shows schematically an exemplary configuration of a reflective interferometric sensor.

FIG. 7 shows schematically one possible configuration of a reflective interferometric sensor 1. The supply fiber 5 connects the sensor head 2 to an optoelectronic module 13 which is used for light generation and detection and for evaluation. The meanings of the reference symbols can be found in the list of reference symbols. In order to explain FIG. 7, reference is made to the patent application submitted to the European Patent Office on Sep. 3, 2003, with the application number EP 03405641.6 and from the same applicant. Except for the adjustment means 10, FIG. 2 therein corresponds essentially to the present FIG. 7. Reference is made to the associated figure description (page 14 last paragraph to page 15, first paragraph of the cited patent application with the application number EP 03405641.6, in the filed version) for an explanation of the sensor design and of its operation, and this reference is hereby expressly included in the disclosure content.

Sensor heads and sensors described herein can be used to measure large DC currents, such as those which occur in the electrochemical industry or electrically powered smelting furnaces. Large coil diameters are required there because of the large conductor cross sections.

A further example of a high-voltage installation, which may have a current sensor as described herein, is a high-voltage switchgear assembly, for example a gas-insulated switchgear assembly. A high-voltage installation such as this can advantageously have in each case one or two sensors or sensor heads per phase or high-voltage conductor.

It will be appreciated by those skilled in the art that the present invention can be embodied in other specific forms without departing from the spirit or essential characteristics thereof. The presently disclosed embodiments are therefore considered in all respects to be illustrative and not restricted.

The scope of the invention is indicated by the appended claims rather than the foregoing description and all changes that come within the meaning and range and equivalence thereof are intended to be embraced therein.

| List of Reference Symbols | |
|---|---|
| 1 | Current sensor |
| 2 | Sensor head |
| 3 | Sensor fiber |
| 4 | Phase-delay element, polarization-defining element |
| 5 | Supply fiber, polarization-defining element |
| 6 | Capillary |
| 7 | Friction-reducing means, oil |
| 8 | Coil |
| 9a, 9b | Markings |
| 10 | Adjustment means |
| 11 | Mount body |
| 12 | Neutral plane of the mount body |
| 13 | Optoelectronic module |
| 14 | Light source, laser, LED, super luminescence diode |
| 15 | Depolarizer |
| 16 | Fiber coupler |
| 17 | Phase modulator |
| 18 | Detector, photo diode |
| 19 | Signal line |
| 20 | Signal processor |
| 21 | Control line |
| 22 | 0° fiber splice or plug connector |
| 23 | 90° splice |
| 24 | Mirror, mirrored end |
| 25 | Polarization-maintaining fiber coupler |
| 26 | Silicone |
| 27 | Fiber cladding |
| 28 | Fiber core |
| 29 | Fiber coating |
| A | Coil plane |
| f | Fast axis |
| I | Electric current |
| L | Current conductor, busbar |
| $N_S$ | Surface normal |
| N | Number of turns of the sensor coil |
| R | Preferred bending direction |
| $S_N$ | Normalized signal |
| T | Temperature |
| V | Verdet constant of the sensor fiber material |
| $\beta, \beta'$ | Angles |
| $\delta$ | Phase shift |
| $\delta_b, \delta_0, \delta_1$ | Phase shifts |
| $\Delta\phi_R$ | Current-induced phase shift |
| $\epsilon$ | Angle |
| $\phi_F$ | Faraday phase shift $V \cdot N \cdot I$ |

The invention claimed is:

1. A fiber-optic sensor head for an optical current or magnetic-field sensor, comprising:
an optical fiber having a magnetooptically active sensor fiber that is optically connected to at least one polarization-defining element, the sensor head being flexible in an area of the sensor fiber, wherein the sensor fiber is arranged in the form of a coil around a conductor which carries the current to be measured or in a magnetic field to be measured, with the sensor fiber coil defining a coil plane with a surface normal, with the at least one polarization-defining element having a marked axis; and
an adjustment means for adjustment of at least one predeterminable angle between the marked axis and the surface normal or for adjustment of predeterminable angles between the marked axes and the surface normal, wherein the sensor fiber is a fiber which has not been thermally treated at at least the softening temperature of the sensor fiber material, and wherein the adjustment means contains a mount body, to which the at least one polarization-defining element is fixed, and the mount body is a flexibly deformable mount body.

2. The sensor head as claimed in claim 1, wherein the sensor fiber is arranged in a capillary.

3. The sensor head as claimed in claim 1, wherein the adjustment means is provided to achieve reproducibility of overall birefringence of the sensor fiber, wherein the adjustment means can be used to set at least one angle reproducibly, when the sensor fiber is changed to a different shape after calibration of the current or magnetic-field sensor and before installation of the coil at a usage location.

4. The sensor head as claimed in claim 3, wherein the overall birefringence is made up essentially of the following contributions:
bending-induced birefringence,
intrinsic birefringence as a result of internal stress in the sensor fiber and as a result of the fiber core of the sensor fiber not having a perfectly rotationally symmetrical shape,
stress at fiber splices in the sensor head, and
birefringence resulting from the fact that the sensor fiber has initial curvature in an unstressed state.

5. The sensor head as claimed in claim 1, wherein the at least one polarization-defining element is at least one polarizer or at least one phase-delay element, or at least one polarization-maintaining supply fiber.

6. The sensor head as claimed in claim 1, wherein the mount body is configured in such a manner that it and the fixing of the polarization-defining element define the relative position of at least one marked axis with respect to the coil plane.

7. The sensor head as claimed in claim 1, wherein the sensor fiber extends along a longitudinal axis of the mount body, and wherein a bending direction of the mount body is predetermined at right angles to the longitudinal axis.

8. The sensor head as claimed in claim 7, wherein when the mount body is bent in the bending direction, the sensor fiber is arranged in or close to the neutral plane of the mount body.

9. The sensor head as claimed in claim 1, wherein at least one of the angles is chosen as a function of:
intrinsic birefringence of the sensor fiber and birefringence at splices,
bending-induced birefringence, and
birefringence resulting from initial curvature of the sensor fiber in such a manner that
the influence of changes in the bending-induced birefringence or
the influence of changes in the at least one angle on measurement signals, which can be produced by a current or magnetic-field sensor with the sensor head, is minimal.

10. The sensor head as claimed in claim 9, wherein the sensor fiber is arranged essentially in the coil plane, and
wherein the polarization-defining element is a polarization-maintaining supply fiber, with a phase-delay element being arranged between the polarization-maintaining supply fiber and the sensor fiber and having a phase delay angle which differs from the phase-delay angle of an ideal phase-delay element by an angle $\epsilon$ other than zero, and with the at least one angle being chosen to be $\beta=0°\pm n\times 90°$ or $\beta=45°\pm n\times 90°$, wherein n is a positive integer or is zero, or
wherein the polarization-defining elements are two supply fibers, with a phase-delay element in each case being arranged between the supply fibers and the sensor fiber, with at least one of the two phase-delay elements having a phase-delay angle which differs from the phase-delay angle of an ideal phase-delay element by an angle $\epsilon$ other than zero, and with the at least one angle β, β' being chosen to be β=β'=0°±n×90° or β=β'=45°±n×90°, wherein n is a positive integer or is zero.

11. The sensor head as claimed in claim 1, wherein markings are provided, and are fitted to the adjustment means in such a manner that the coil has an integer number of turns when the markings are arranged in a suitable manner with respect to one another.

12. A current or magnetic-field sensor, in combination with sensor head as claimed in claim 1.

13. The current or magnetic-field sensor as claimed in claim 12, wherein the sensor
   a) is an interferometric sensor in a reflection configuration with a polarization-maintaining supply fiber as one polarization-defining element, and with one marked axis being one of the principle axes of the supply fiber, or
   b) is an interferometric sensor in a Sagnac configuration with two polarization-maintaining supply fibers as polarization-defining elements, and with the two marked axes each being one of the principle axes of the two supply fibers, or
   c) is a polarimetric sensor in a reflection configuration with a polarizer as the polarization-defining element or with a polarization-maintaining supply fiber as the plarization defining element, and with one marked axis running along the transmission direction of the polarizer or along a principal axis of the polarization-maintaining supply fiber, or
   d) is a polarimetric sensor in a Sagnac configuration with two polarizers as polarization-defining elements or with two polarization-maintaining supply fibers as polarization-defining elements, and with the two marked axes running along the transmission directions of the two polarizers or along the principal axes of the polarization-maintaining supply fibers.

14. A high-voltage installation, comprising:
a high-voltage switchgear assembly having a sensor head as claimed in claim 1.

15. A method for production of a sensor head for an optical current or magnetic-field sensor, comprising:
   optically connecting a magnetooptically active sensor fiber to at least one polarization-defining element, arranged in the form of a coil, with a fiber which has not been thermally treated at at least the softening temperature of the sensor fiber material being used as the sensor fiber;
   mounting the polarization-defining element to a mount body of the adjustment means, wherein the mount body is flexibly deformable;
   defining a coil plane of the coil with a surface normal, the polarization-defining element having a marked axis;
   calibrating the current or magnetic-field sensor, with the sensor fiber arranged in the form of a coil; and
   adjusting, when the sensor fiber is arranged in the form a coil, an angle between the marked axis and the surface normal to a magnitude of the calibration.

16. A fiber-optic sensor head, comprising:
   an optical fiber having a magnetooptically active sensor fiber that is optically connected to at least one polarization-defining element, the sensor head being flexible in an area of the sensor fiber, wherein the sensor fiber is arranged in proximity to a conductor which carries a charge to be measured or which provides a magnetic field to be measured, with the sensor fiber defining a plane with a surface normal, with the at least one polarization-defining element having a marked axis; and
   an adjustment means for adjustment of at least one predeterminable angle between the marked axis and the surface normal,
   wherein the sensor fiber is a fiber which has not been thermally treated at at least the softening temperature of the sensor fiber material, and
   wherein the adjustment means contains a mount body, to which the at least one polarization-defining element is fixed, and the mount body is a flexibly deformable mount body.

17. The sensor head according to claim 16, wherein the adjustment means is provided to achieve reproducibility of overall birefringence of the sensor fiber, wherein the adjustment means can be used to set at least one angle reproducibly, when the sensor fiber is changed to a different shape after calibration of the current or magnetic-field sensor and before installation at a usage location.

18. The sensor head as claimed in claim 16, wherein at least one of the angles is chosen as a function of:
   intrinsic birefringence of the sensor fiber and birefringence at splices,
   bending-induced birefringence, and
   birefringence resulting from initial curvature of the sensor fiber in such a manner that
   the influence of changes in the bending-induced birefringence or
   the influence of changes in the at least one angle on measurement signals, which can be produced by a current or magnetic-field sensor with the sensor head, is minimal.

19. The sensor head as claimed in claim 1, wherein the fiber coating has been removed from the sensor fiber.

20. The sensor head as claimed in claim 2, wherein the capillary contains a friction-reducing means.

21. The sensor head as claimed in claim 20, wherein the friction-reducing means is silicone oil.

22. The sensor head as claimed in claim 1, wherein the mount body is used as the adjustment means and is composed of glass-fiber-reinforced plastic.

23. The sensor head as claimed in claim 2, wherein the capillary is mounted in a groove which extends along a longitudinal axis of a plastic strip acting as the mounting body.

24. The sensor head as claimed in claim 23, wherein the capillary is mounted in the groove by means of silicone.

25. The sensor head as claimed in claim 24, wherein the attachment of the capillary is along the entire sensor fiber, or is at discrete points.

26. The sensor head as claimed in claim 1, wherein the mount body has a complete fixation of the capillary or the sensor fiber such that the shape of the coil is identical during calibration and at the usage location.

27. The sensor head as claimed in claim 2, wherein the mount body has a complete fixation of the capillary or the sensor fiber such that the shape of the coil is identical during calibration and at the usage location.

28. The sensor head as claimed in claim 2, wherein the fiber coating has been removed from the sensor fiber.

29. The sensor head as claimed in claim 2, wherein the sensor fiber extends along a longitudinal axis of the mount body, and wherein a bending direction of the mount body is predetermined at right angles to the longitudinal axis.

30. The sensor head as claimed in claim 3, wherein the sensor fiber extends along a longitudinal axis of the mount body, and wherein a bending direction of the mount body is predetermined at right angles to the longitudinal axis.

31. The sensor head as claimed in claim 4, wherein the sensor fiber extends along a longitudinal axis of the mount body, and wherein a bending direction of the mount body is predetermined at right angles to the longitudinal axis.

32. The sensor head as claimed in claim 5, wherein the sensor fiber extends along a longitudinal axis of the mount body, and wherein a bending direction of the mount body is predetermined at right angles to the longitudinal axis.

33. The sensor head as claimed in claim 6, wherein the sensor fiber extends along a longitudinal axis of the mount body, and wherein a bending direction of the mount body is predetermined at right angles to the longitudinal axis.

* * * * *